US009006624B2

(12) United States Patent
Brosnan et al.

(10) Patent No.: US 9,006,624 B2
(45) Date of Patent: Apr. 14, 2015

(54) RESONANT FREQUENCY DETECTION FOR INDUCTION RESONANT INVERTER

(75) Inventors: Daniel Brosnan, Louisville, KY (US); Mariano Filippa, Louisville, KY (US); Kresimir Odorcic, Louisville, KY (US)

(73) Assignee: General Electric Company, Schenectady, NY (US)

( * ) Notice: Subject to any disclaimer, the term of this patent is extended or adjusted under 35 U.S.C. 154(b) by 484 days.

(21) Appl. No.: 12/841,247

(22) Filed: Jul. 22, 2010

(65) Prior Publication Data

US 2012/0018426 A1 Jan. 26, 2012

(51) Int. Cl.

| | |
|---|---|
| ***H05B 6/36*** | (2006.01) |
| ***G05F 1/00*** | (2006.01) |
| ***H02M 3/335*** | (2006.01) |
| ***G01R 19/00*** | (2006.01) |
| ***H05B 6/06*** | (2006.01) |
| ***H05B 6/04*** | (2006.01) |

(52) U.S. Cl.

CPC . *H05B 6/062* (2013.01); *H05B 6/04* (2013.01)

(58) Field of Classification Search

CPC .................................. H05B 6/04; H05B 6/062
USPC ................. 219/620, 621, 626, 630, 635, 650, 219/660–661, 668, 672; 315/307, 248, 211, 315/310–311, 300, 302, 123, 125, 128; 363/21.08, 21.09, 21.15, 21.16, 23, 25, 363/28, 40, 55, 56.07, 58, 98, 110, 115, 363/127, 163; 324/102, 133, 52, 66, 67, 324/127

See application file for complete search history.

(56) References Cited

U.S. PATENT DOCUMENTS

| | | | | |
|---|---|---|---|---|
| 3,821,509 | A * | 6/1974 | Amagami et al. | 219/668 |
| 3,986,115 | A * | 10/1976 | Huang | 324/102 |
| 4,802,076 | A * | 1/1989 | Asai | 363/19 |
| 4,810,847 | A * | 3/1989 | Ito | 219/626 |
| 5,006,973 | A | 4/1991 | Turner | |
| 5,453,667 | A | 9/1995 | Matsuda | |
| 5,648,008 | A * | 7/1997 | Barritt et al. | 219/626 |
| 5,968,398 | A * | 10/1999 | Schmitt et al. | 219/626 |
| 6,011,708 | A | 1/2000 | Doht et al. | |
| 6,040,986 | A * | 3/2000 | Sakamoto et al. | 363/21.02 |
| 6,316,753 | B2 | 11/2001 | Clothier et al. | |
| 6,323,468 | B1 * | 11/2001 | Dabelstein et al. | 219/617 |
| 6,995,988 | B2 * | 2/2006 | Shyi | 363/21.06 |
| 2002/0003139 | A1 * | 1/2002 | Ohishi et al. | 219/661 |
| 2002/0096954 | A1 * | 7/2002 | Shinozaki | 310/90.5 |
| 2005/0277360 | A1 * | 12/2005 | Benedek et al. | 446/236 |
| 2010/0006563 | A1 | 1/2010 | Schilling et al. | |

* cited by examiner

*Primary Examiner* — Dana Ross
*Assistant Examiner* — Ket D Dang
(74) *Attorney, Agent, or Firm* — Douglas D. Zhang; GE Global Patent Operation

(57) ABSTRACT

An induction heating system includes an induction heating coil operable to inductively heat a load with a magnetic field, a detector for detecting a current feedback signal corresponding to a current flowing through the induction heating coil, and a controller for detecting a switching transient in the current feedback signal and determining a resonant frequency of the system based on a characteristic of the switching transient.

8 Claims, 10 Drawing Sheets

At Resonance

Above Resonance

RESONANT FREQUENCY DETECTION FOR INDUCTION RESONANT INVERTER

BACKGROUND OF THE INVENTION

The present disclosure generally relates to induction heating, and more particularly to an induction heating apparatus capable of detecting a resonant frequency of a resonant power inverter for the induction heating apparatus.

Induction cook-tops heat conductive cooking utensils by magnetic induction. An induction cook-top applies radio frequency current to a heating coil to generate a strong radio frequency magnetic field on the heating coil. When a conductive object or vessel, such as a pan, is placed over the heating coil, the magnetic field coupling from the heating coil generates eddy currents on the vessel. This causes the vessel to heat.

In order to properly drive the induction cook-top or heating system, it is important to have an accurate assessment of the resonant frequency of the resonant power inverter being used to drive the induction cooktop. Operating the resonant power inverter at the proper frequency such as at, or slightly above resonance, can be advantageous for a number of reasons. Some of these reasons include, for example, achieving maximum power transfer between the induction heating coil and the object or vessel on the induction heating coil, and maintaining safe working and operating conditions. Operating the induction system at a sub-resonant frequency can result in damage to the induction heating system due to limitations of a half bridge resonant inverter power supply.

The resonant frequency of the resonant power inverter can also provide information as to the load conditions of the induction heating coil. This information can include, for example, the size and type of object that is placed on the induction cook-top. One example of a system for detecting an object on an induction cooktop and correspondingly controlling power to the induction heating coil is disclosed in U.S. patent application Ser. No. 13/154,190 entitled "Induction Cooktop Pan Sensing", filed on Jun. 6, 2011 and assigned to the assignee of the instant application, the disclosure of which is incorporated herein by reference in its entirety.

There are multiple methods of object or vessel detection on an induction cook-top. Some of these include mechanical switching, phase detection, optical sensing and harmonic distortion sensing. In some systems, these detection methods typically use a current transformer to detect the resonant voltage. When the system is operating at resonance, optimal power transfer between the induction heating coil and the object on the induction heating coil will occur. However, a current transformer will always provide a clean sine wave of power output to the induction heating coil, whether the system is operating in resonance or non-resonance. The sinusoidal nature of the output signal produced by the current-transformer is not dependent upon resonance and there will be little to no distortion due to switching. Also, current-transformer packages tend to have large package sizes and footprints, and can be expensive.

Accordingly, it would be desirable to provide a system that addresses at least some of the problems identified above.

BRIEF DESCRIPTION OF THE INVENTION

As described herein, the exemplary embodiments overcome one or more of the above or other disadvantages known in the art.

One aspect of the exemplary embodiments relates to an induction heating system. In one embodiment, the induction heating system includes an induction heating coil operable to inductively heat a load with a magnetic field, a detector for detecting a current feedback signal corresponding to a current flowing through the induction heating coil, and a controller for detecting a switching transient in the current feedback signal and determining a resonant frequency of the system based on a characteristic of the switching transient.

In another aspect, the exemplary embodiments relate to a method for determining a resonant frequency of an induction heating system. In one embodiment, the method includes detecting a current feedback signal in an induction heating apparatus, the current feedback signal corresponding to a current flow through an induction heating coil of the induction heating apparatus, detecting a switching transient on the current feedback signal, comparing a characteristic of the detected switching transient to a set of pre-determined values, and determining a resonant frequency of the induction heating apparatus from the characteristic.

In a further aspect, the exemplary embodiments relate to a computer program product stored in a memory that includes a computer readable program device for detecting a current feedback signal in an induction heating apparatus, the current feedback signal corresponding to a current through the induction heating apparatus, a computer readable program device for analyzing the current feedback signal to determine a switching transient on the current feedback signal, a computer readable program device for comparing a magnitude of the detected switching transient to a set of predetermined values, and a computer readable program device for determining a resonant frequency of the induction heating apparatus from the magnitude of the detected switching transient.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Moreover, the drawings are not necessarily drawn to scale and unless otherwise indicated, they are merely intended to conceptually illustrate the structures and procedures described herein. In addition, any suitable size, shape or type of elements or materials could be used.

DETAILED DESCRIPTION OF THE EXEMPLARY EMBODIMENTS OF THE DISCLOSURE

Figure 1:
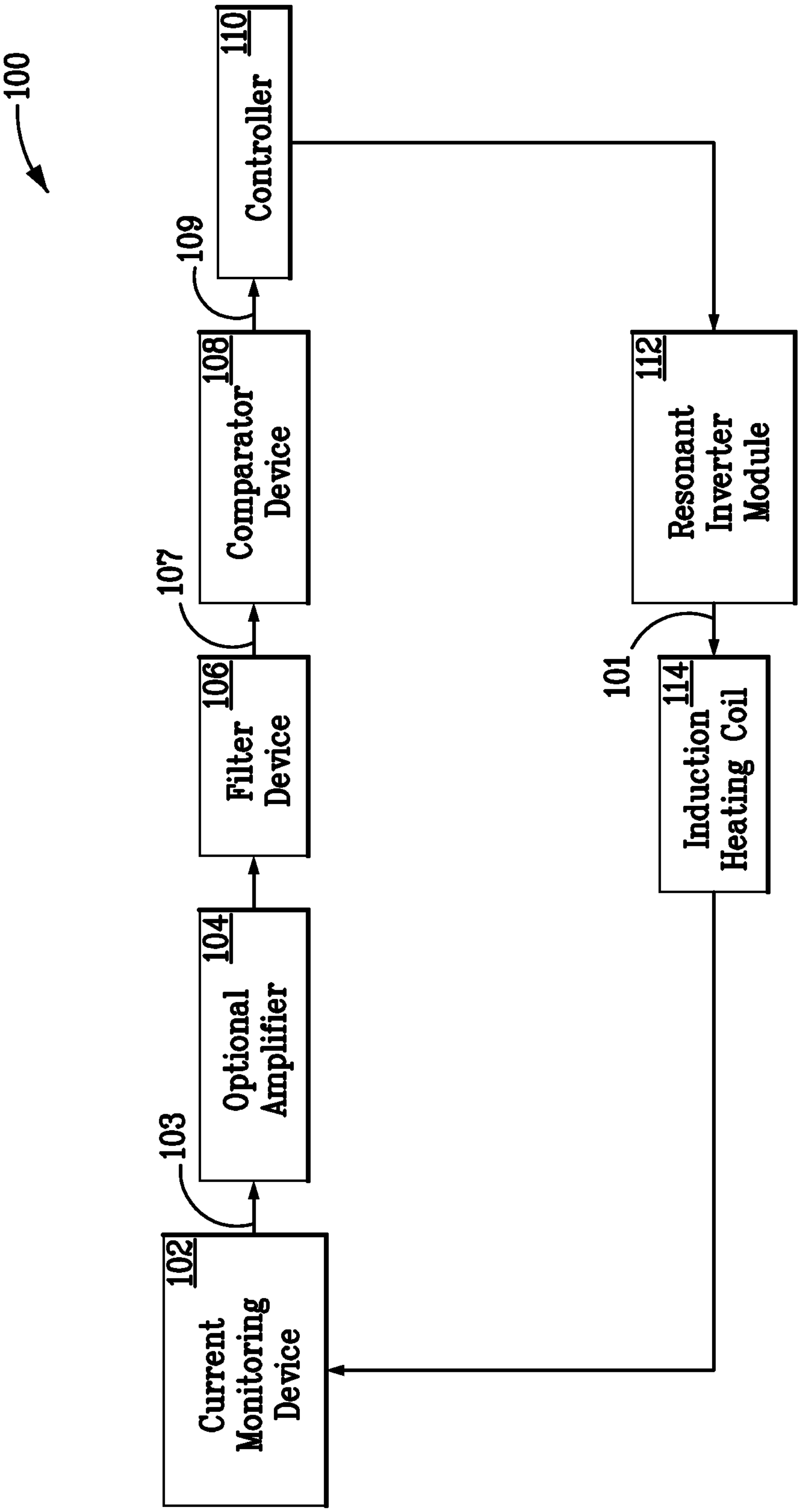
FIG. 1 shows a schematic block diagram of an induction heating system according to an embodiment of the present disclosure.

FIG. 1 is a schematic block diagram of an induction heating system 100 according to one embodiment of the present disclosure. The aspects of the disclosed embodiments are generally directed to detecting the resonant frequency of a resonant power inverter used in induction cooking. The resonant frequency detection can then be used to make decisions on how to drive the inverter, protect against sub-resonant conditions, increase system efficiency, reduce system component heat and provide control and user feedback, for example.

As shown in FIG. 1, the induction heating coil 114 receives a power signal 101 that is supplied through a resonant power inverter, referred to herein as a resonant inverter module 112. The resonant inverter module 112 is generally configured to supply the high frequency power signal 101 at the required operating frequency to the induction heating coil 114. A current monitoring device or detector 102 is configured to detect and measure a current signature of the power signal 101, which represents the current flow through induction heating coil 114. The aspects of the disclosed embodiments are directed to constantly monitoring the current flowing through the load of the resonant inverter module 112. The load of the resonant inverter module 112 generally comprises the induction heating coil 114 and any object or vessel that is present on the induction heating coil 114. The object or vessel on the induction heating coil 114, such as for example a pan, will be generally referred to herein as a vessel.

The current monitoring device 102 generates current feedback signal 103, which is the signature of the current of the power signal 101. In one embodiment, the current feedback signal 103 comprises a voltage signal that equates to or is derived from the current of the power signal 101 flowing through the induction heating coil 114. The current feedback signal 103 is used to determine the resonant frequency of the system 100. When a conductive vessel is placed on the induction heating coil 114, the power required to drive the induction heating coil 114 will be affected and the resonant frequency of the system 100 will change according to the type and size of the vessel. The current feedback signal 103 will include evidence of the resonant frequency of the system 100. The aspects of the disclosed embodiments can determine the resonant frequency from the current feedback signal 103 and adjust the operating frequency of the system 100 to match the resonant frequency.

Figure 2:
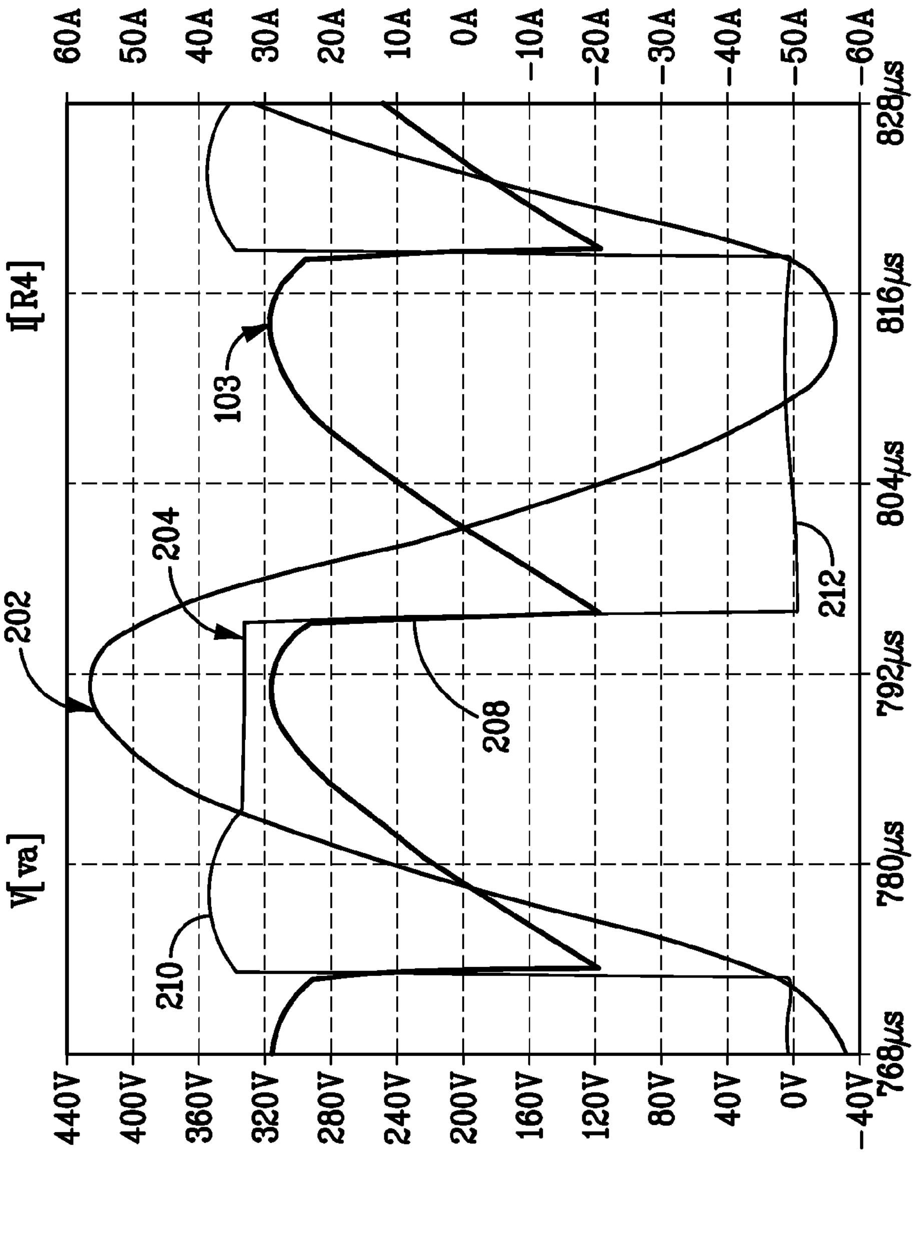
FIG. 2 is an exemplary graph illustrating signal signatures in an induction heating system according to an embodiment of the present disclosure.

FIG. 2 illustrates a plot of an exemplary AC power signal 202 to the induction heating coil 114, the switching signal 204 controlling the switching of the AC power through the induction heating coil 114 and the current feedback signal 103. As shown in FIG. 2, the waveform of the power signal 202, which in this example is a substantially sinusoidal signal, represents the high frequency AC power flowing through the induction heating coil 114. The waveform of the switching signal 204, which in this example is substantially a square wave, represents the switching cycle of the AC power by the resonant inverter module 112 through the induction heating coil 114. The current feedback signal 103 is represented by the chopped sinusoid waveform and will change dependant upon load conditions related to a vessel on the induction heating coil 114 and whether the system 100 is operating below, at or above the resonant frequency. For purposes of explanation, reference numeral 103 shall be used to characterize the current feedback signal in each of the figures herein.

As is shown in FIG. 2, the waveform for current feedback signal 103 sharply transitions along each edge 208. Edges 208 generally correspond to the rising and falling edges of the waveform of the switching signal 204. The current feedback signal 103 will include transients or spikes corresponding to the sharp transitions of the edges 208, referred to herein as switching transients 218. Processing the current feedback signal 103 to capture the switching transients 218 corresponding to the edges 208 can be used to provide evidence of the resonant frequency of the system 100.

Figure 3:
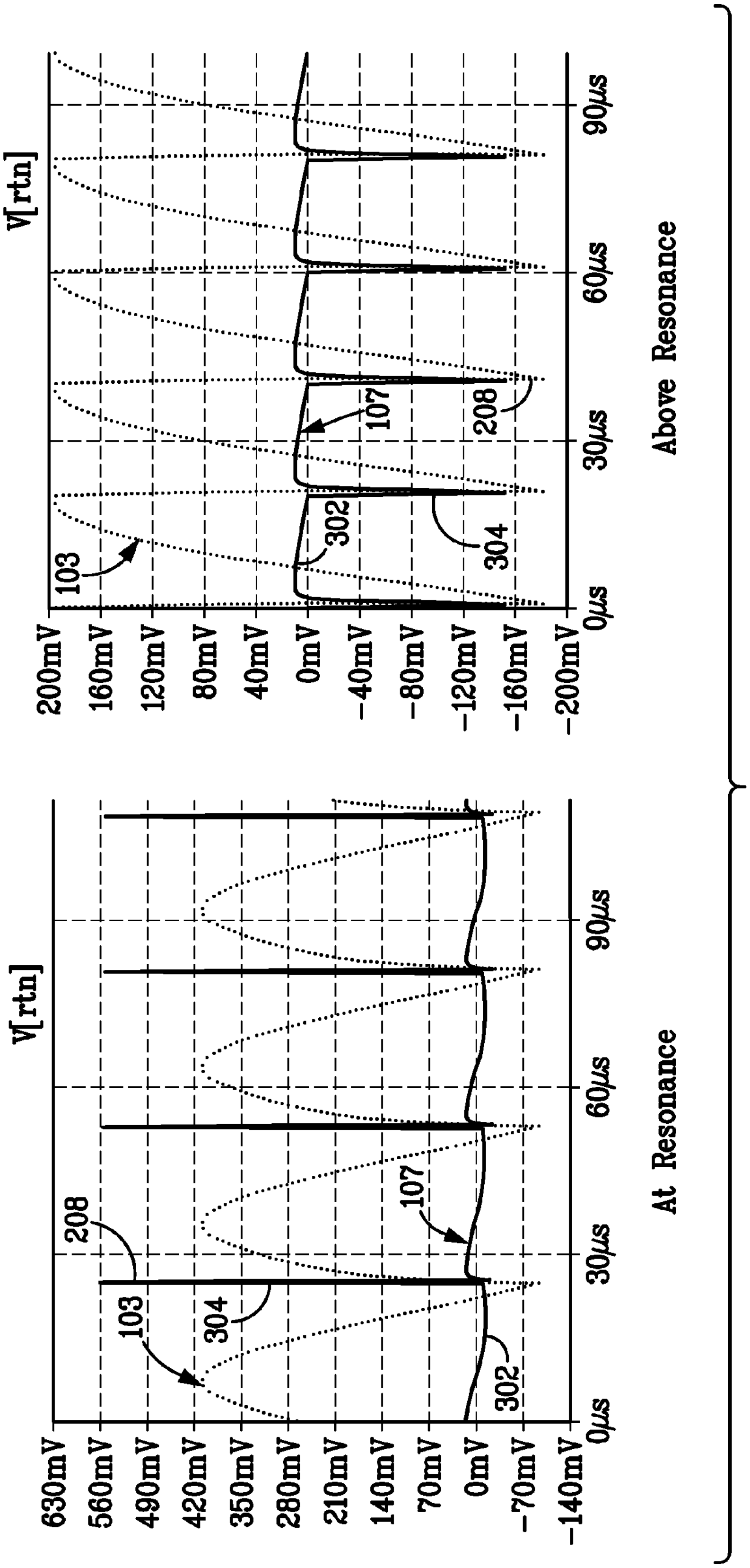
FIG. 3 illustrates exemplary graphs of resonant and non-resonant signal signatures in an induction heating system according to an embodiment of the present disclosure.

When the system 100 is operating at a frequency that is at or below the resonant frequency, the switching of the current through the induction heating coil 114 will generate transitions or switching transients 218 that are generally positive in magnitude. When the system 100 is operating at a frequency that is above the resonant frequency, the switching transients 218 will generally be negative in magnitude. In FIG. 3, the graph to the right illustrates a current feedback signal 103 when the system 100 is operating at a frequency that is above resonance. In this graph, the edges and thus the switching transients 218 are negative going in magnitude. The graph to the left in FIG. 3 illustrates an exemplary current feedback signal 103 when the system 100 is at or near resonance. In this graph, the edges 208 and switching transients 218 are generally positive in magnitude.

Figure 7:
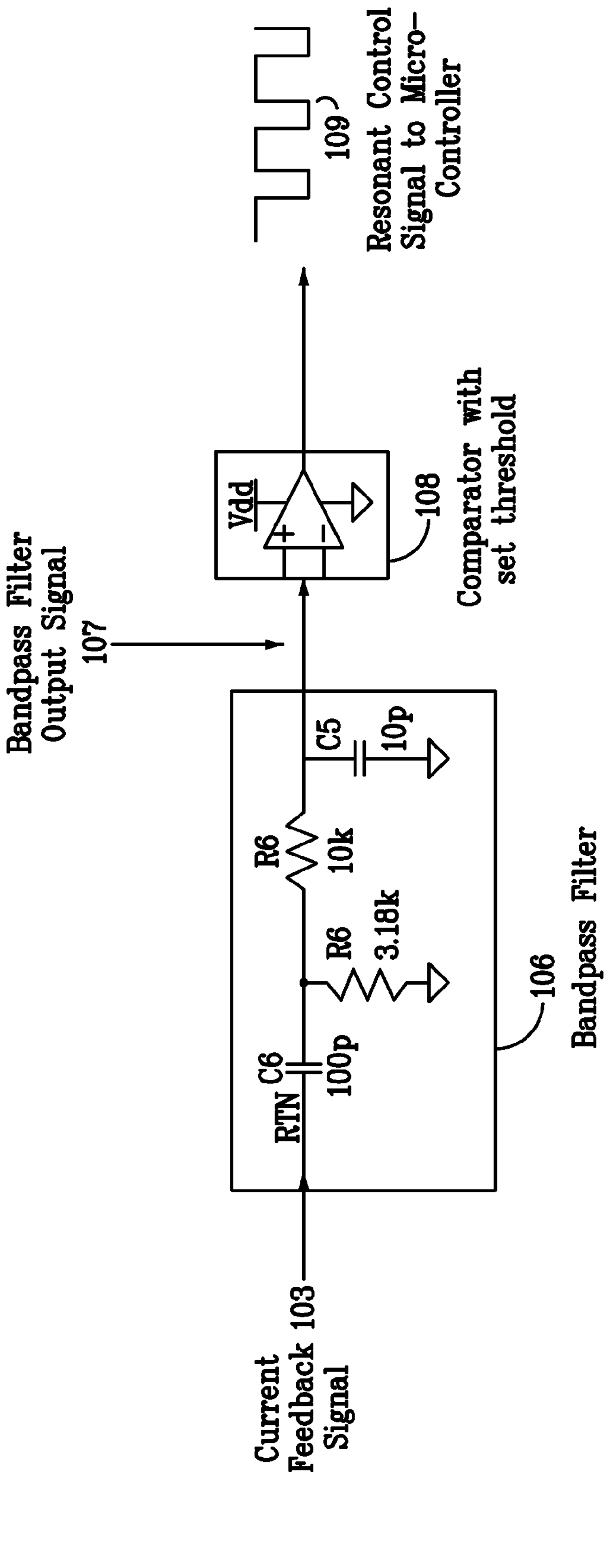
FIG. 7 illustrates a schematic diagram of exemplary circuit elements that can be used in an embodiment of the present disclosure.

As shown in FIG. 1, in one embodiment, a filter device 106 is used to process the current feedback signal 103. In one embodiment, the filter device 106 comprises a band-pass filter. In alternate embodiments, any suitable filter device can be used that will capture switching transients 218 generated by the transitions or edges 208 of the current feedback signal 103, such as for example, a low pass filter. In one embodiment, the current feedback signal 103 is fed through an amplifier 104 to buffer and amplify the current feedback signal 103 before it is fed to the filter device 106. One example of a filter device 106 is shown in FIG. 7. The arrangement and choice of elements for the filter device 106 are configured so that the filter device 106 acts as a derivative circuit with a high impedance to minimize the effects of the induction network. In alternate embodiments, any suitable arrangement of circuit elements for a filter that will process and capture the transients that are a result of the switching of the power signal through the induction heating coil 114 by the resonant inverter module 112 can be used. In one embodiment, the filter device 106, as well as the other components of FIG. 1, are physically or functionally incorporated into a controller(s) that includes one or more processors for carrying out the required functions as is described herein.

The output signal 107 from the filter device 106 captures the transient voltage spikes on the current feedback signal 103. Exemplary waveforms of the output signal 107 of the filter 106 for different resonance conditions are shown in FIGS. 3 and 4.

FIG. 3 illustrates exemplary waveform plots comparing the current feedback signal 103 to the corresponding output signal 107 of the filter device 106 under different resonant conditions. The graph to the left is at or near resonance, while the graph to the right is above resonance. As shown in FIG. 3, the waveform of the output signal 107 of the filter device 106, which comprises the resonant peaks of the current feedback signal 103, includes a baseline level 302 and spikes or transients 304. The magnitude of the spikes 304 is indicative of the resonant frequency of the system 100.

Figure 4A:
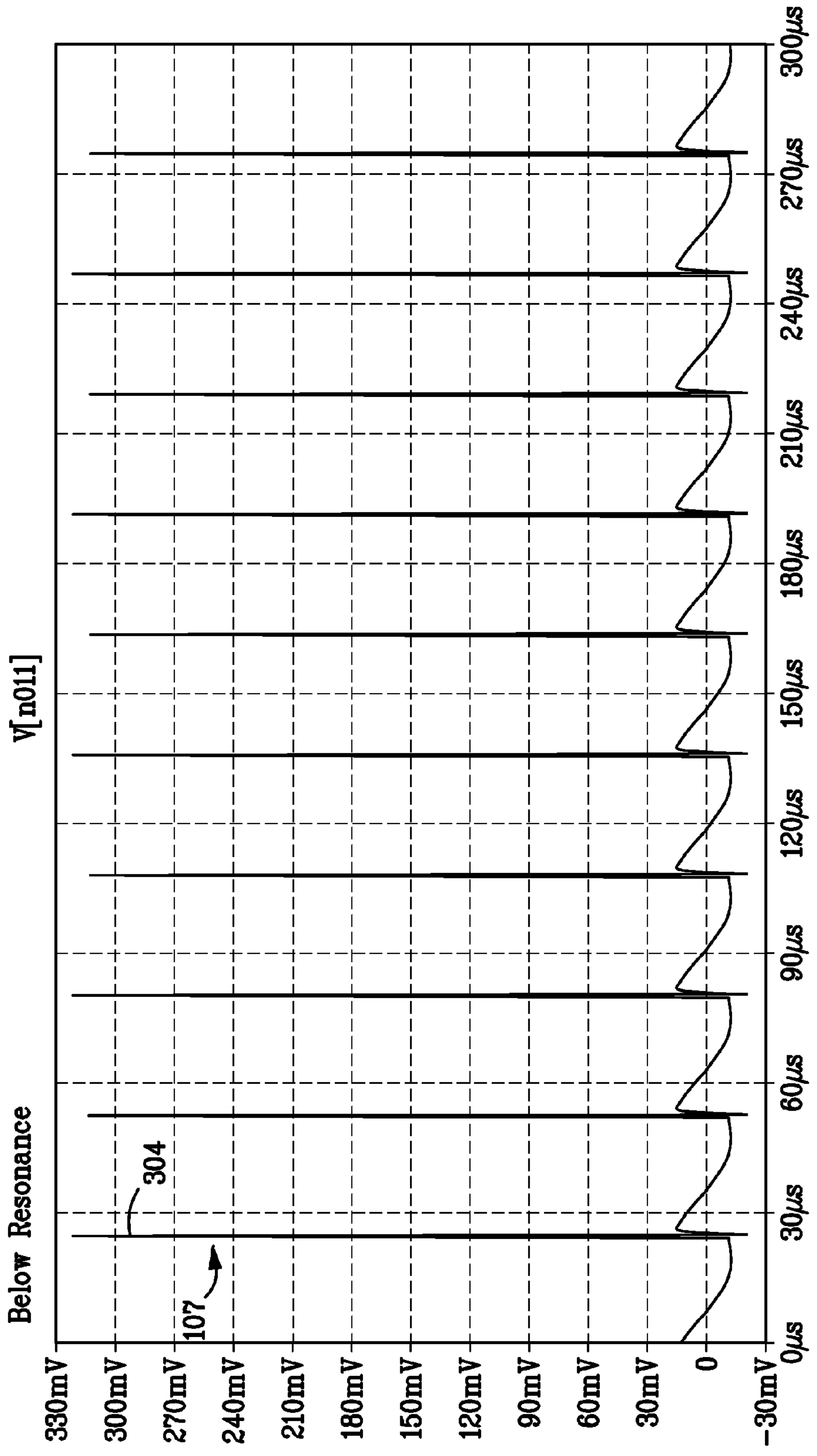
FIG. 4 illustrates exemplary graphs of resonant and non-resonant filter device output signal signatures in an induction heating system according to an embodiment of the present disclosure.
Figure 4B:
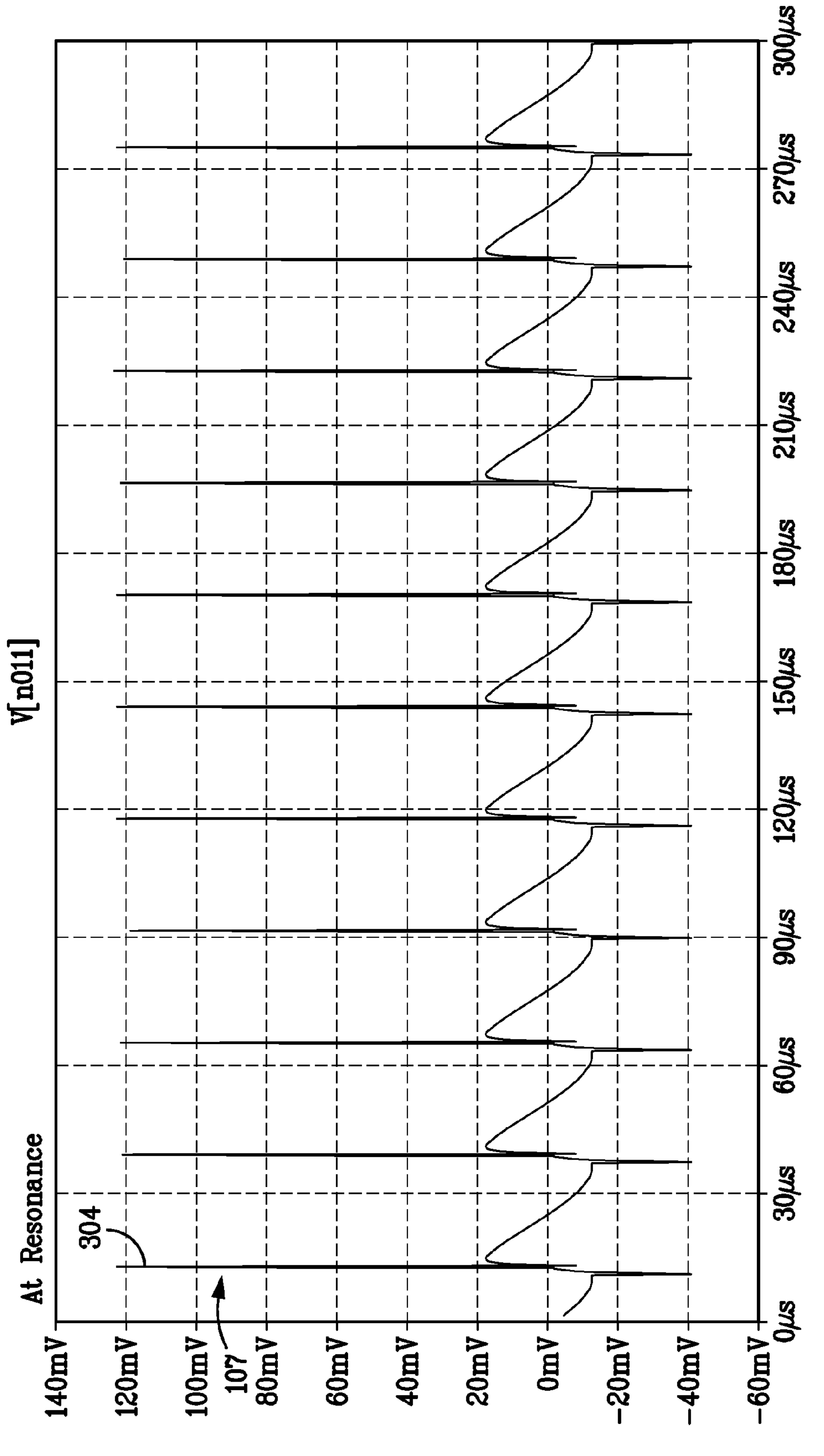
Figure 4C:
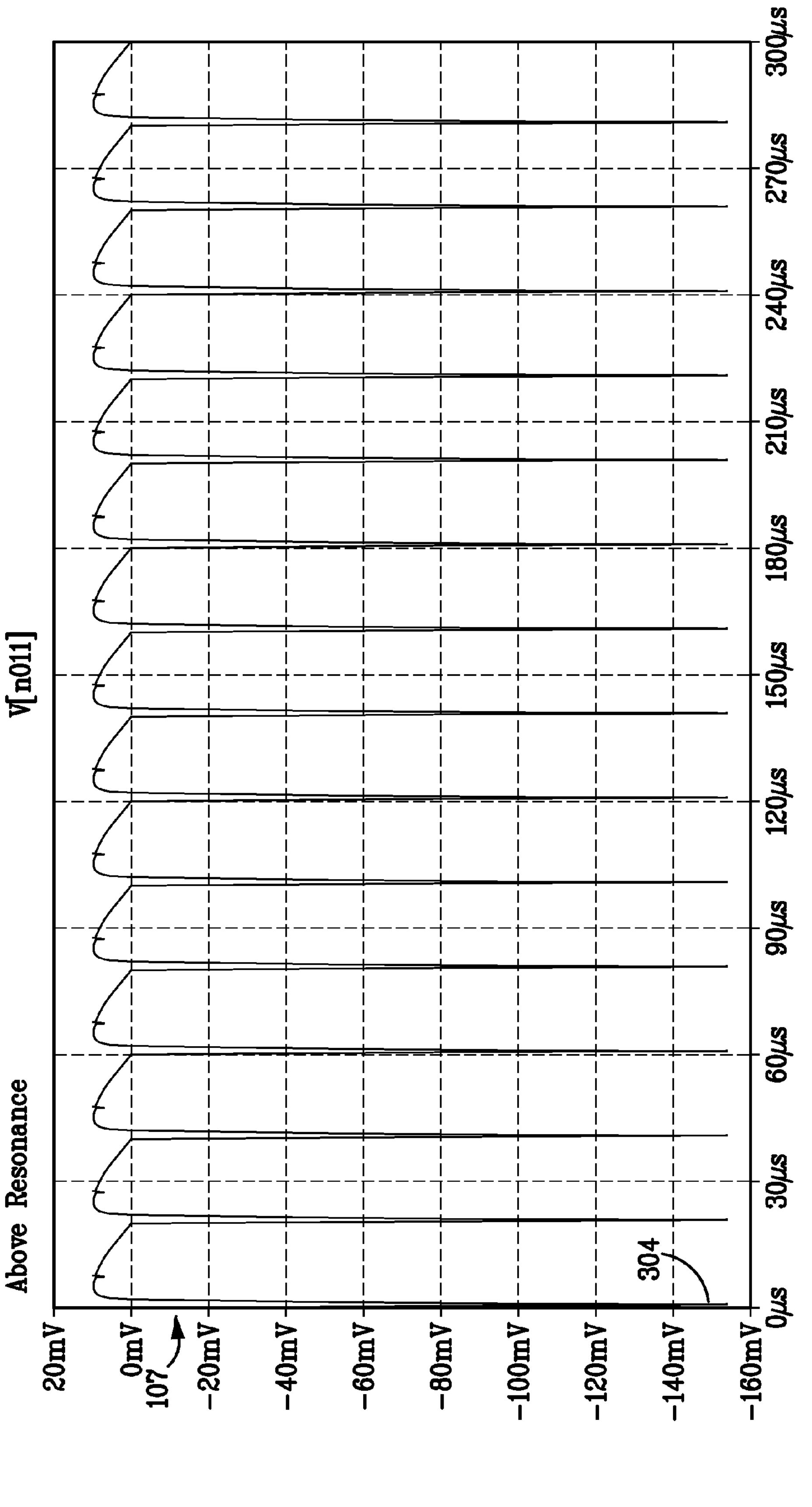

FIG. 4 illustrates exemplary plots of the output signal 107 of the filter device 106 of a system 100 operating under different resonance conditions. As shown in the graphs of FIG. 4, the characteristics and magnitude of the output signal 107 of the filter device 106 will vary depending upon the resonant frequency of the system 100 and the current operating frequency. The upper graph illustrates the output signal 107 for a system 100 operating below resonance. In the middle graph of FIG. 4 the system 100 is operating at or near resonance, while in the bottommost graph the system is operating above resonance. When the system 100 is operating at or below resonance, the magnitudes of the spikes 304 are generally positive going in magnitude. When the system 100 is operating above resonance, the magnitudes of the spikes 304 are generally negative going in magnitude. In one embodiment, the magnitude of the spikes 304 can be compared to known or pre-determined operating parameters to provide an indication of the resonant frequency of the system 100.

In one embodiment, the output signal 107 is processed by a comparator device 108 as is shown in FIG. 1. The comparator device 108 is generally configured to compare the magnitude of the spikes 304 of the output signal 107 to a set of known threshold values. In one embodiment, the set of known threshold values is stored in a look-up table or database, and can be related to a corresponding or pre-determined set of resonant frequencies for certain load or other operating conditions or parameters of the induction heating system 100. The pre-determined set of resonant frequencies is generally determined by experimentation under different operating conditions of an induction heating system 100. This can include for example, determining switching cycle transients and the corresponding resonant frequencies when cooking vessels of different size, placement and materials are used in conjunction with the induction heating coil 114, which can then be stored as operating frequencies. In one embodiment, the comparator device 108 can be configured so that a trigger value of the comparator device 108 points to a specific operating frequency in the look-up table. One example of a comparator device 108 that can be used in accordance with the disclosed embodiments is shown in FIG. 7. In alternate embodiments, any suitable device that can be triggered at set values corresponding to the processing of the result of the capture of transients of a signal can be utilized. In one embodiment, the comparator device 108 can be included as part of, or function of, a controller that includes one or more processors configured to carry out the comparison and pointing described here.

In one embodiment, the comparator device 108 is configured to generate a control signal 109 based on the trigger value and the operating frequency to which the trigger value points. In one embodiment, the control signal 109 is a digital signal pulse train that is processed by the controller 110. In alternate embodiments, the control signal 109 is any suitable signal format. The processing of the control signal 109 by the controller 110 can include, for example, determining the resonant frequency of the system 110, detecting a vessel on the induction heating coil 114, interrupting the powering of the induction heating coil 114. In one embodiment, the control signal 109 is used by the controller 110 to set the operating frequency of the system 100 by controlling the switching of the cycle of the switching signal 204 which will impact the power signal 202 directly based on the proximity of the cycle of the switching signal 204 to the resonance of the system 100. The magnitude of the power signal 202 derived from the switching signal 204 will generally be linearly correlated to the power delivered to the induction coil 114 and vessel combination. In one embodiment, the controller 110 includes one or more processors configured to execute and provide the switching control signal 109 described herein.

The control signal 109 can be used to adjust the switching cycle or frequency of the power signal 101 flowing to the induction heating coil 114. The resonant inverter module 112 controls the switching of the direction of the power signal 101 flowing through the induction heating coil 114. In one embodiment, the filter device 106, comparator device 108, controller 110 and resonant inverter module 112 could be configured into one or more controllers with suitable processors configured to execute the processes described herein.

Figure 5:
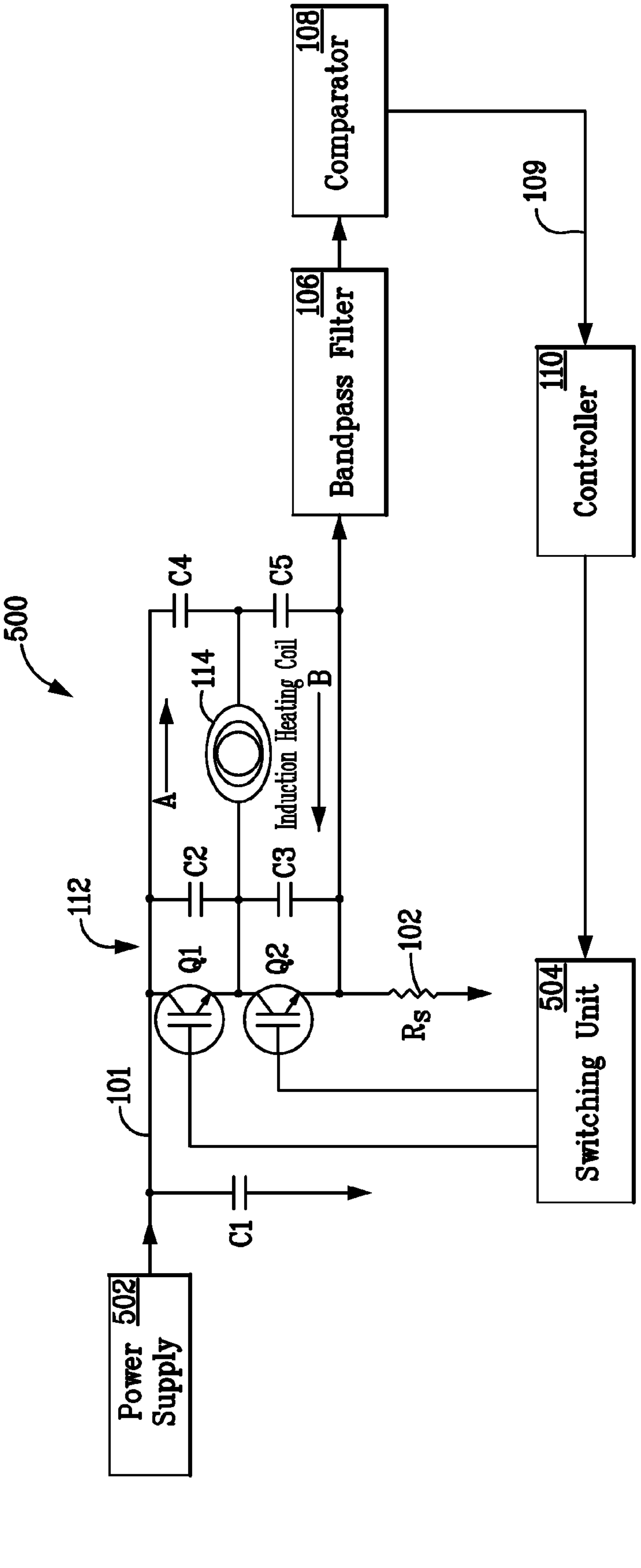
FIG. 5 is a schematic of an exemplary circuit according to an embodiment of the present disclosure.

FIG. 5 illustrates one embodiment of an exemplary circuit 500 for the system 100 according to one aspect of the present disclosure. The circuit elements and connections shown in FIG. 5 are merely exemplary, and in alternate embodiments, any suitable circuit elements may be utilized. As shown in FIG. 5 the induction heating circuit 500 comprises a power supply input device 502, as will be generally understood in the art. The resonance inverter module 112 is provided with switching devices Q1 and Q2, which provide power to the load, which is comprised of the induction heating coil 114 and any vessel or object thereon, by the controlled switching oft heating coil 114 is powered with high frequency current in the power signal 101 from power input 502. The direction A, B of the current flow through the induction heating coil 114 is controlled by the switching of transistors Q1 and Q2. Switching unit 504 provides the controlled switching of the switching devices Q1, Q2 based on the switching control signal from the controller 110. In one embodiment, transistors Q1 and Q2 are insulated-gate bipolar transistors (IGBT) and the switching unit 504 is a Pulse Width Modulation (PWM) controlled half bridge gate driver integrated circuit. In alternate embodiments, any suitable switching devices can be used, other than including IGBT's. Snubber capacitors C2, C3 and resonant capacitors C4, C5 are connected between a positive power terminal and a negative power terminal to successively resonate with the induction heating coil 114. The induction heating coil 114 is connected between the switching devices Q1, Q2 and induces an eddy current to the vessel (not shown) located on or near the induction heating coil 114 by using the generated resonant currents to induce a magnetic field which is coupled to a vessel. This coupling induces eddy currents in the vessel. The eddy current heats the vessel on the induction heating coil 114 as is generally understood in the art.

Referring to FIG. 5, the resonant inverter module 112 powers the induction heating coil 114 with high frequency current, and the switching of switching devices Q1 and Q2 by switching unit 504 controls the direction A, B, of this current. In one embodiment, this switching occurs at a switching frequency in a range that is between approximately 20 kilohertz to 50 kilohertz. As shown in FIG. 2, when the cycle of the switching control signal 204 from the switching unit 504 is at a high state 210, transistor Q1 is switched ON and transistor Q2 is switched OFF. When the cycle of the switching control signal 204 is at a low state 212, transistor Q2 is switched ON and transistor Q1 is switched OFF. When transistor Q1 is triggered on, the current of the power signal 101 flows through the induction heating coil 114 in the direction A. When transistor Q2 is triggered on, the current of the power signal 101 flows through the induction heating coil 114 in direction B.

If switching device Q1 is turned on, and switching device Q2 is turned off, the resonance capacitor C5, and the induction coil 114 (including any vessel thereon) form a resonance circuit. If the switching device Q1 is turned off, and switching device Q2 is turned on, the resonance capacitor C4 and the induction coil 114 (including any object thereon) form the resonance circuit. In this example, the current feedback signal 103 is the feedback voltage across shunt resistor Rs, which corresponds to the current of the power signal 101 flowing through the induction coil 114.

As is seen in FIG. 3, when the system 100 is at or near resonance, as reflected in the graph to the left, the transitions in the cycling of current feedback signal 103 are substantially smooth because the system 100 is switching at zero current. In the curve to the right in FIG. 3, the current feedback signal 103 is represented as a "chopped sinusoid" because the system 100 is switching at a non-zero current. When the system 100 is not operating at the resonant frequency, a rapid peak forms at the switching when the voltage polarity is reversed across the heating coil 114 which causes the shunt resistor Rs to charge the snubber capacitors C2, C3, which discharge through the switching devices Q1, Q2. Using the shunt resistor Rs to generate the current feedback signal 103 provides distinct advantages over a current transformer/transducer, which yields a clean sinusoidal wave regardless of resonance. The use of the shunt resistor Rs will provide a signature for the current feedback signal 103 that depends upon a frequency of operation.

Operating at or near the resonant frequency of the system 100 is key to transferring the optimal amount of power from the induction coil 114 to the vessel on the induction coil 114. It can generally be expected that when the system 100 is operating at a frequency that is above the resonant frequency of the system 100, the magnitude of the spikes 304 will be relatively small or have a negative magnitude, as is shown in the lowermost graph of FIG. 4. As the operating frequency folds back to points below the resonant frequency, the magnitude of the spikes 304 will begin to increase, as is illustrated in the middle and topmost graphs of FIG. 4. In one embodiment, the aspects of the disclosed embodiments can including sweeping the operating frequency of the system 100 from high to low for example, until a specified increase in the magnitude of the spikes 304 in the output signal 107 of the filter device 106 is noted. Although the operating frequency can also be swept from low to high, operating the system 100 at a frequency below resonance is not preferred. The change in magnitude of the spikes 304 can be used to determine the resonant frequency of the system 100. In this embodiment, the comparator 108 can be used to detect variations in the magnitude of the spikes 304 and point to a pre-determined resonant frequency when the change in magnitude provides the trigger point for the comparator 108.

Figure 6:
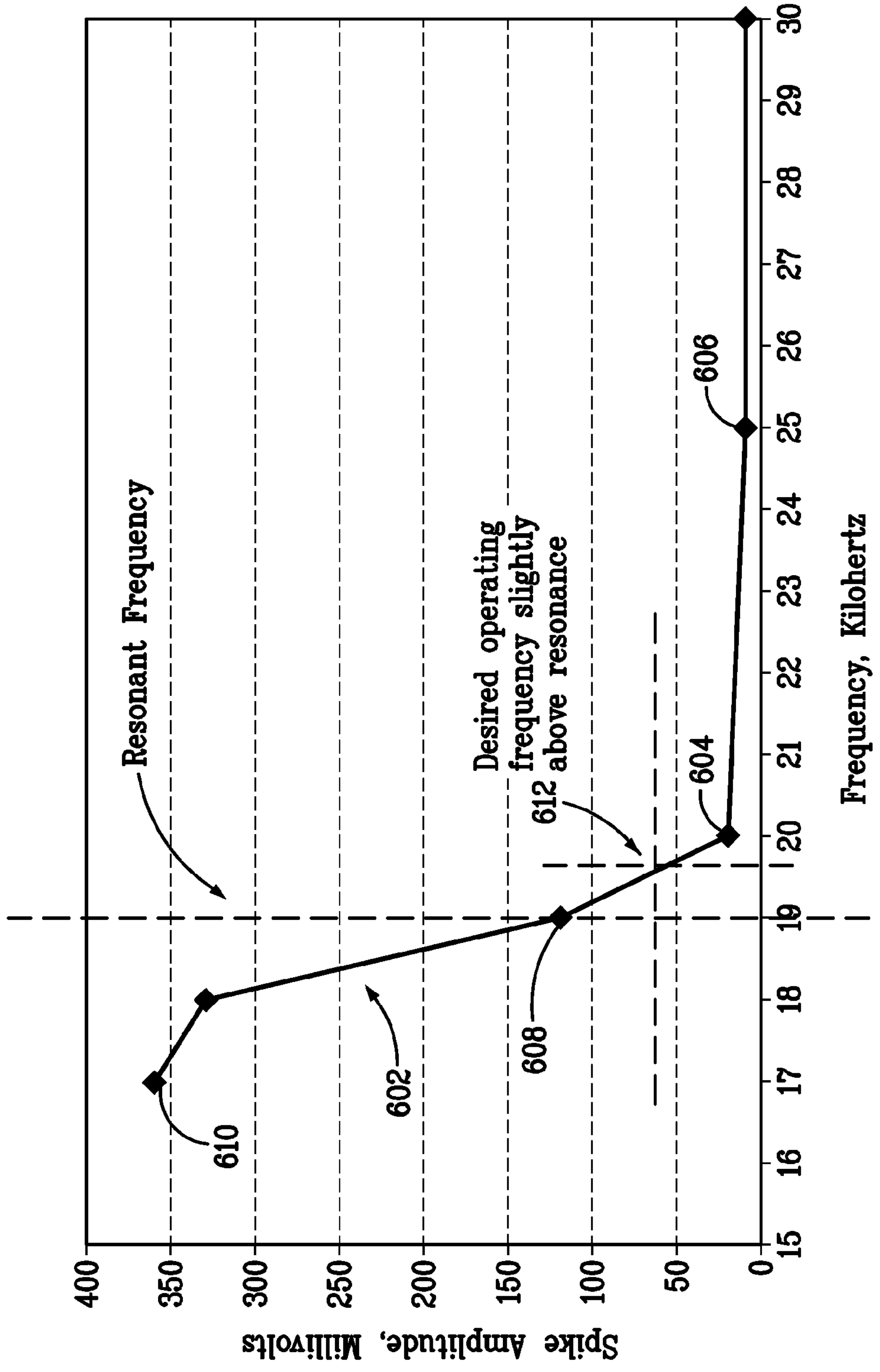
FIG. 6 is a graph illustrating an exemplary plot of switching transient amplitudes versus frequency according to an embodiment of the present disclosure.

FIG. 6 illustrates a plot 602 of the amplitudes of the spikes 304 of the output signal 107 of the filter device 106 versus frequency. In this example, as the frequency (along the X-axis) sweeps from a high value to a lower value along the plot 602, the amplitude of spike 304 increases in magnitude. When the operating frequency is greater than approximately 20 kilohertz, the amplitude of spike 304 is substantially constant, remaining in a range of approximately 0 to 25 millivolts, as is illustrated at points 604 and 606. As the operating frequency shifts to less than 20 kilohertz, there is a progressive increase in the amplitude of spike 304, as illustrated by points 608 and 610 on the plot 602.

In one embodiment, a change in the magnitude of the spikes 304 that exceeds a pre-determined value can be used to determine the resonant frequency of the system. This information is sent to the controller 110, which causes the switching module 504 of FIG. 5 to correspondingly adjust the operating frequency of the system 100. In the example shown in FIG. 6, the resonant frequency is determined to be approximately 19 kilohertz, corresponding to point 608 on the plot 602.

Since it will be generally understood that the inverter system 100 can be damaged by operating at a frequency that is below the value of the resonant frequency, it can be advantageous to operate the system 100 at a level that is slightly above or higher than the resonant frequency. Accordingly, in one embodiment, the desired operating frequency can be set at a level that is slightly above the resonant frequency 608, such as the frequency corresponding to point 612 on plot 602 of FIG. 6. In one embodiment, the frequency chosen to be the operating frequency can be in the range of approximately 0.5% to 2% higher than the determined resonance frequency. In alternate embodiments, any suitable parameter can be used to establish an operating frequency that is slightly greater than the resonant frequency.

The aspects of the disclosed embodiments can provide fixed parameters for determining the resonant frequency, depending on the characteristics of the signature of the current feedback signal 103. The characteristics of the signature of the current feedback signal 103 will be dependent on the resonance of the system 100, including the induction coil 114 (and any vessel on the induction coil 114). The desired operating frequency can be set by varying the threshold of the triggering of the comparator 108 and the sweep characteristics.

Figure 8:
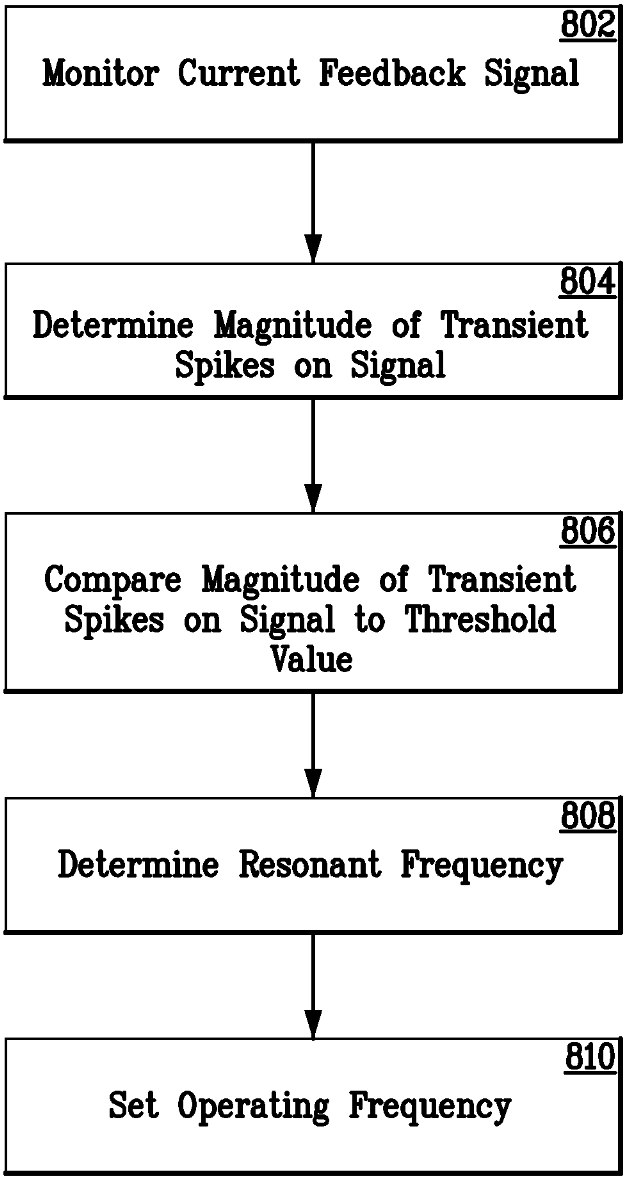
FIG. 8 illustrates an exemplary process according to an embodiment of the present disclosure.

FIG. 8 illustrates one example of a process according to an aspect of the disclosed embodiments. In one embodiment, the current feedback signal 103 is monitored 802. A magnitude of transient spikes 304 due to switching of switching devices Q1 and Q2 by switching unit 504 is determined 804. The magnitude of the transient spikes 304 are compared 806 to a table of set values to determine 808 a resonant frequency of the system 100. In one embodiment, a variation in the magnitude of the transient spikes 304 as an operating frequency of the system is swept over a range of frequencies is compared 806 to a table of set values to determine 808 the resonant frequency. Once the resonant frequency is determined 808, the operating frequency is adjusted or set 810. In one embodiment, this comprises setting 810 the operating frequency to a value that is slightly above the determined resonant frequency.

The aspects of the disclosed embodiments may also include software and computer programs incorporating the process steps and instructions described above that are executed in one or more computers. In one embodiment, one or more computing devices, such as a computer or the controller 110 of FIG. 1, are generally adapted to utilize program storage devices embodying machine readable program source code, which is adapted to cause the computing devices to perform the method steps of the present disclosure. The program storage devices incorporating features of the present disclosure may be devised, made and used as a component of a machine utilizing optics, magnetic properties and/or electronics to perform the procedures and methods of the present disclosure. In alternate embodiments, the program storage devices may include magnetic media such as a diskette or computer hard drive, which is readable and executable by a computer. In other alternate embodiments, the program storage devices could include optical disks, read-only-memory ("ROM") floppy disks and semiconductor materials and chips.

The computing devices may also include one or more processors or microprocessors for executing stored programs. The computing device may include a data storage device for the storage of information and data. The computer program or software incorporating the processes and method steps incorporating features of the present disclosure may be stored in one or more computers on an otherwise conventional program storage device.

The aspects of the disclosed embodiments will determine a signature of a current feedback signal through an induction heating coil in a resonant inverter system, and be able to correct or adjust an operating frequency of the induction heating system accordingly to meet resonance or other appropriate operating frequency. This will aid in optimizing system performance, energy transfer, pan detection, energy efficiency, meeting agency requirements, enabling product features, suppressing electromagnetic and audible noise, and protecting against unsafe or damaging over voltage and under voltage conditions.

Thus, while there have been shown, described and pointed out, fundamental novel features of the invention as applied to the exemplary embodiments thereof, it will be understood that various omissions and substitutions and changes in the form and details of devices illustrated, and in their operation, may be made by those skilled in the art without departing from the spirit of the invention. Moreover, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An induction heating, system comprising:

an induction heating coil operable to inductively heat a load with a magnetic field;

a switching device coupled between the induction heating coil and a power source, the switching device being configured to provide power to the load;

a detector for generating a current feedback signal at an output of the switching device corresponding to a current flowing through the induction heating coil, the detector comprising a shunt resistor in series with a return path of current flowing through the induction heating coil to ground; and a controller for detecting, a switching transient in the current feedback signal and determining a resonant frequency of the system based on a characteristic of the switching transient, the controller being configured to determine whether the switching transient is positive or negative in magnitude and identify that the system is operating at or below the resonant frequency when it is determined that the switching transient is positive in magnitude and that the system is operating above the resonant frequency when the switching transient is negative in magnitude.

2. The system of claim 1, wherein the controller further comprises a filter device for processing the current feedback signal and detecting the switching transient.

3. The system of claim 2, further comprising a comparator configured to compare a magnitude of the switching transient from the filter device to a pre-determined level, and determine the resonant frequency of the system based on the comparison.

4. The system of claim 3, wherein the comparator is further configured to provide an operating, frequency control signal that corresponds to the determined resonant frequency and is used to adjust an operating frequency of the system.

5. The system of claim 1, wherein the controller is further configured to adjust an operating frequency of the system to a value that is equal to or above the determined resonant frequency.

6. The system of claim 1, wherein the controller is further configured to determine the resonance frequency of the system from a comparison of the detected transient to a set of known system resonance parameters.

7. The system of claim 1, wherein the controller is further configured to:

sweep an operating frequency of the system from a high frequency to a low frequency;

detect a change in a magnitude of the switching transient on the current feedback signal that exceeds a pre-determined level during the sweep; and determine the resonant frequency of the system based on the detected change in magnitude of the switching transient.

8. The system of claim 1, wherein the characteristic of the switching transient is a magnitude of the switching transient or a change in magnitude of the switching transient.

* * * * *